United States Patent
Gris

[19]

[11] Patent Number: 6,114,743
[45] Date of Patent: Sep. 5, 2000

[54] WELL ISOLATION BIPOLAR TRANSISTOR

[75] Inventor: Yvon Gris, Tullins, France

[73] Assignee: SGS-Thomson Microelectronics S.A., Gentilly, France

[21] Appl. No.: 09/390,891

[22] Filed: Sep. 7, 1999

Related U.S. Application Data

[62] Division of application No. 08/987,095, Dec. 8, 1997.

[30] Foreign Application Priority Data

Dec. 10, 1996 [FR] France ................................ 96/15389

[51] Int. Cl.$^7$ ....................... H01L 27/082; H01L 27/102; H01L 29/70; H01L 31/11
[52] U.S. Cl. ..................... 257/586; 257/587; 257/588; 438/361; 438/339
[58] Field of Search ........................ 257/587, 588, 257/586; 438/361, 339, 359

[56] References Cited

U.S. PATENT DOCUMENTS

| | | | |
|---|---|---|---|
| 4,338,138 | 7/1982 | Cavaliere et al. ..................... | 438/348 |
| 4,339,767 | 7/1982 | Horung et al. ........................ | 357/44 |
| 4,392,149 | 7/1983 | Horng et al. ........................ | 357/49 |
| 4,829,015 | 5/1989 | Schaber et al. ..................... | 438/348 |
| 4,887,145 | 12/1989 | Washio et al. ...................... | 357/59 |
| 4,933,733 | 6/1990 | Iranmanesh et al. ................. | 357/34 |
| 4,969,026 | 11/1990 | Van der Velden et al. ........... | 357/34 |
| 5,061,645 | 10/1991 | Nakazato et al. ................... | 438/348 |
| 5,128,271 | 7/1992 | Bronner et al. ..................... | 437/31 |
| 5,187,554 | 2/1993 | Miwa .................................. | 307/586 |

OTHER PUBLICATIONS

French Search Report from French Patent Application 96 15389, filed Dec. 10, 1996.
Patent Abstracts of Japan, vol. 015, No. 114 (E–1047), Mar. 19, 1991 & JP–A–03 004538 (Toshiba Corp.).

*Primary Examiner*—David Hardy
*Assistant Examiner*—Allan R. Wilson
*Attorney, Agent, or Firm*—Wolf, Greenfield & Sacks, P.C.; James H. Morris; Theordore E. Galanthay

[57] ABSTRACT

The present invention relates to an integrated circuit including a lateral well isolation bipolar transistor. A first portion of the upper internal periphery of the insulating well is hollowed and filled with polysilicon having the same conductivity type as the transistor base, to form a base contacting region. A second portion of the upper internal periphery of the insulating well is hollowed and filled with polysilicon having the same conductivity type as the transistor emitter, to form an emitter contacting region.

11 Claims, 3 Drawing Sheets

WELL ISOLATION BIPOLAR TRANSISTOR

CROSS REFERENCE TO RELATED APPLICATIONS

This application is a division of U.S. application Ser. No. 08/987,095, filed Dec. 8, 1997, entitled WELL ISOLATIONS BIPOLAR TRANSISTOR, now pending.

BACKGROUND OF THE INVENTION

1. Field of the Invention

The present invention relates to the field of manufacturing of integrated circuits.

2. Discussion of the Related Art

More specifically, in the field of integrated circuits, primary components have to be separated and more or less laterally isolated from one another. The most current technology to reach such results is the so-called LOCOS technology in which the various primary components are separated from one another by thick oxide layers formed by thermal growth. Another developing technique which tends is the so-called well isolation technology, called "BOX" technology. In BOX technology, the intervals between primary components are formed of trenches grooved by anisotropic etching into the upper surface of a single crystal silicon wafer and filled with an insulator, usually silicon oxide, the upper surface being planarized by several techniques, for example by chem-mech polishing (CMP) with a stop on a silicon nitride layer previously formed above the silicon area to be isolated.

SUMMARY OF THE INVENTION

The present invention relates to integrated circuits using this latter technique of isolation between primary components.

It more specifically aims at implementing bipolar transistors of optimum performance, notably as concerns the reduction of stray capacitances and thus the operating speed of these transistors.

Another object of the present invention is to obtain bipolar transistors with reduced access resistances.

Another object of the present invention is to obtain the smallest possible bipolar transistors.

Another object of the present invention is to implement such bipolar transistors by techniques commonly used in the field of manufacturing of integrated circuits.

To achieve these and other objects, the present invention provides a bipolar transistor laterally isolated by a well, wherein a first portion of the upper internal periphery of the insulating well is hollowed and filled with polysilicon having the same conductivity type as the transistor base and a second portion of the upper internal periphery of the insulating well is hollowed and filled with polysilicon having the same conductivity type as the transistor emitter.

According to an embodiment of the present invention, a layer of an SiGe-type material is formed at the interface between the island and the polysilicon having the same conductivity type as the transistor emitter.

The present invention also provides a method for manufacturing a bipolar transistor including the steps of forming an island of an epitaxied layer of the first conductivity type surrounded with a well filled with insulator, etching a portion at least of the upper internal periphery of the well by an anisotropic etching method selective with respect to the epitaxied layer to form a hollowed portion, filling the hollowed portion with polysilicon of the second conductivity type, bringing the upper surface of the polysilicon to be at the same level as the upper surface of the island, performing a base implantation of the second conductivity type, and depositing a second layer of polysilicon of the first conductivity type on a portion of the island and in a shifted manner with respect to the hollowed portion.

According to an embodiment of the present invention, the bipolar transistor manufacturing method includes the steps of forming an island of an epitaxied layer of the first conductivity type surrounded with a well filled with insulator, etching a first portion of the upper internal periphery of the well to form a first hollowed portion, filling the first hollowed portion with polysilicon of the second conductivity type, performing a base implant of the second conductivity type, etching a second portion of the upper internal periphery of the oxide well to form a second hollowed portion, and filling the second hollowed portion with polysilicon of the first conductivity type.

According to an embodiment of the present invention, the method includes the step of siliciding the apparent surfaces of the polysilicon regions.

The foregoing objects, characteristics and advantages of the present invention will be discussed in detail in the following non-limiting description of specific embodiments in connection with the accompanying drawings.

DETAILED DESCRIPTION

In the various drawings, and especially in the cross-sectional views, as usual in the field of the representation of semiconductor components, the several dimensions are not drawn to scale.

Figure 1:
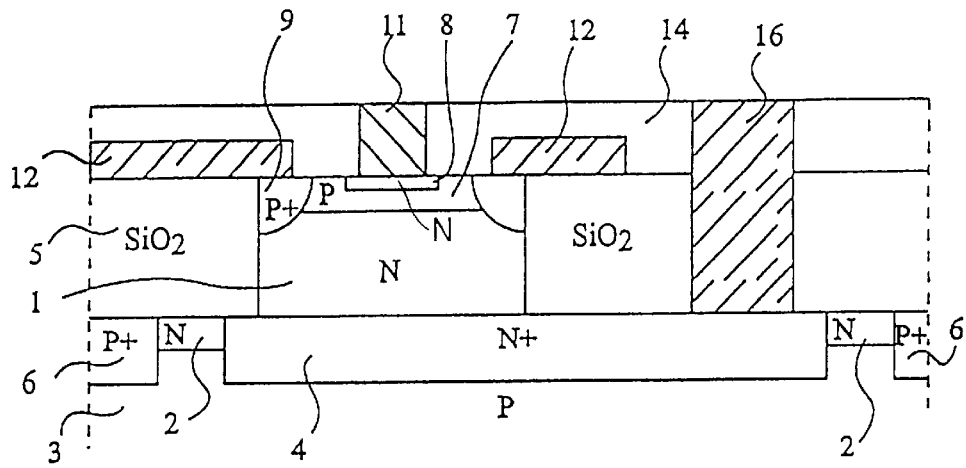
FIG. 1 is a simplified cross-sectional view of a bipolar well isolation transistor of conventional structure.

FIG. 1 shows an example of NPN-type bipolar well isolation transistor of conventional structure.

This transistor is formed in an island 1 of an N-type epitaxied layer 2, itself formed on a P-type single crystal silicon wafer 3. An $N^+$-type buried layer 4 is formed at the interface between the epitaxied layer and the substrate and extends in particular under island 1. This island 1 is laterally defined by a trench 5 filled with silicon oxide which totally surrounds it. In the drawing, trench 5 extends to the upper surface of buried layer 4. It can be slightly deeper or slightly shallower. It must however not completely run through buried layer 4, or else there could be no linkup with the collector, as will be seen hereafter. Preferably, a $P^+$-type buried layer 6 is formed under the location of well 5 to complete the lateral isolation of island 1.

Island 1 forms the collector of the NPN transistor and buried layer 4 forms its collector contact recovery region. In the upper part of island 1 is formed a P-type base region 7 within which an N-type emitter region 8 is formed. A heavily-doped P-type peripheral area 9 forms a base contact recovery region. Base region 7 for example results form a boron implantation. Emitter region 8 is for example formed from a heavily-doped N-type polysilicon layer 11. Base contact recovery peripheral region 9 is for example formed from a heavily-doped P-type polysilicon layer 12. For example, before or after performing base implantation 7, a properly etched polysilicon region 12 is formed, after which a silicon oxide layer 14 planarized by any known method is deposited. Oxide layer 14 is opened at the center of island 1 and filled with polysilicon 11. It is also opened, at the same time as thick oxide layer 5, to form a trench which joins buried layer 4. This trench is filled with N$^+$-type polysilicon 16, for example, concurrently with the filling with emitter polysilicon 11. Then, the contacts are recovered conventionally on the upper surfaces of elements 11, 12, and 16.

This transistor suffers from a number of disadvantages:

polysilicon portion 12 is necessarily misaligned with respect to island 1 of the epitaxied layer;

the centering of the emitter with respect to the base raises a problem, which requires the implementation of relatively sophisticated methods to obtain a self-alignment;

base polysilicon layer 12 necessarily overruns by a certain amount, linked with the positioning tolerances above island 1; this results in a non-negligible contribution to the value of the base-collector capacitance; and the described process necessarily implies a minimum possible dimension associated with the positioning tolerances and the minimum masking dimensions.

Figure 2:
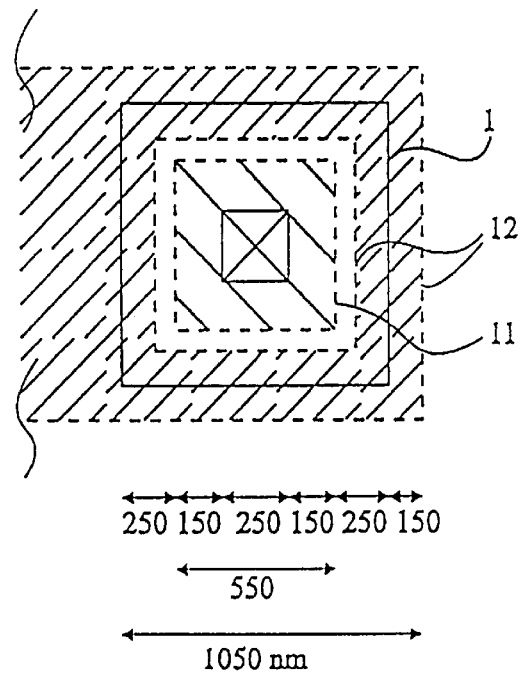
FIG. 2 shows an example of top view of the structure of FIG. 1.

The minimum dimensions of the structure of FIG. 1 are illustrated as an example in the top view of FIG. 2 in which the limits of masks from which various regions are defined have been shown. Island 1 is shaped as a square. Dotted lines 12 designate the internal and external limits of polysilicon layer 12, dotted lines 11 designate the external limits of polysilicon layer 11 and the central cross designates a contact pad. In a technology where the minimum dimension of a pattern on a mask is 0.25 $\mu$m (250 nm), and where the guard distance between two masks is 0.15 $\mu$m (150 nm), the dimensions shown in FIG. 2 (assuming that polysilicon pattern 11 is self-aligned with respect to polysilicon pattern 12 by a spacer) are achieved:

surface area of island 1:1.05×1.05 $\mu$m=1.1 $\mu$m$^2$, emitter surface area: 0.55×0.55 $\mu$m≅0.3 $\mu$m$^2$, emitter perimeter: 550 $\mu$m×4=2.2 mm In this structure, the surface area of island 1 substantially corresponds to the surface of the base-collector junction. The base-collector capacitance (which is desired to be reduced to increase the possible operating speed of the transistor) is proportional to this surface area. It is also desired to reduce the emitter surface area to reduce the emitter current for a given current density. It is also desired to increase the emitter perimeter/surface area ratio to increase the emitter injection power for a given surface area.

The present invention aims at improving the features of a bipolar transistor and at reducing the possible minimum dimensions of a bipolar transistor, which results, in particular, in an increase of the operating speed of the transistor.

Figure 3:
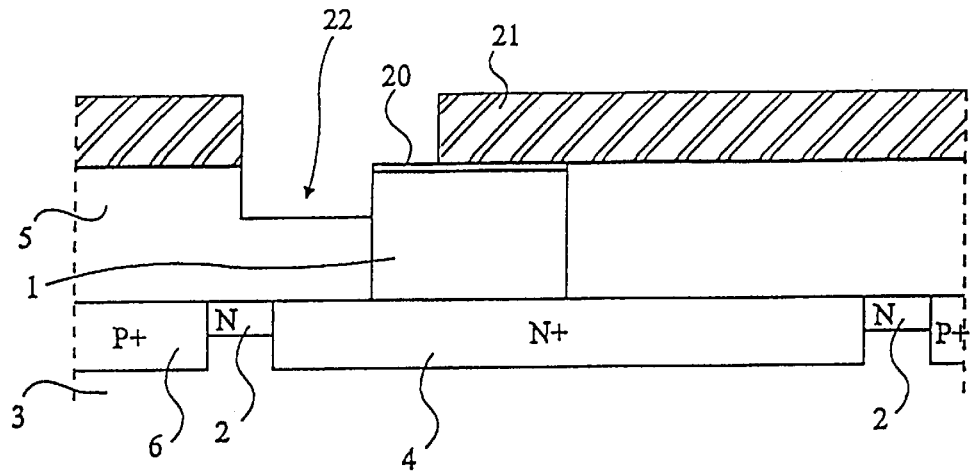
FIGS. 3 to 6 are simplified cross-sectional views representing successive steps of fabrication of a bipolar well isolation transistor according to an embodiment of the present invention.

FIG. 3 shows an embodiment of a transistor according to the present invention at an intermediary step of manufacturing.

A structure including an N-type epitaxied layer 2 formed on a P-type substrate 3 and including buried layers 4 and 6 of type N$^+$ and P$^+$ respectively is used as a starting basis. An island 1 of the epitaxied layer, coated with a thin layer 20 of silicon nitride, is surrounded with a well 5 filled with oxide. Thus, the structure obtained immediately after the formation of oxide wells 5 is used as a starting basis. A layer of photosensitive product 21, which will be now called resist, is then deposited, and this resist layer is opened above at least a portion of the upper periphery of island 1. This opening extends for example along one side of island 1. Then, an anisotropic etching of the silicon oxide is performed, by using a selective etching plasma for the etching of the silicon oxide with respect to the etching of silicon nitride 20 and of the single crystal silicon of island 1. A hollowed portion 22 is thus formed, which extends on a portion only of the thickness of silicon oxide layer 5 along one edge at least of the periphery of island 1.

Figure 4:
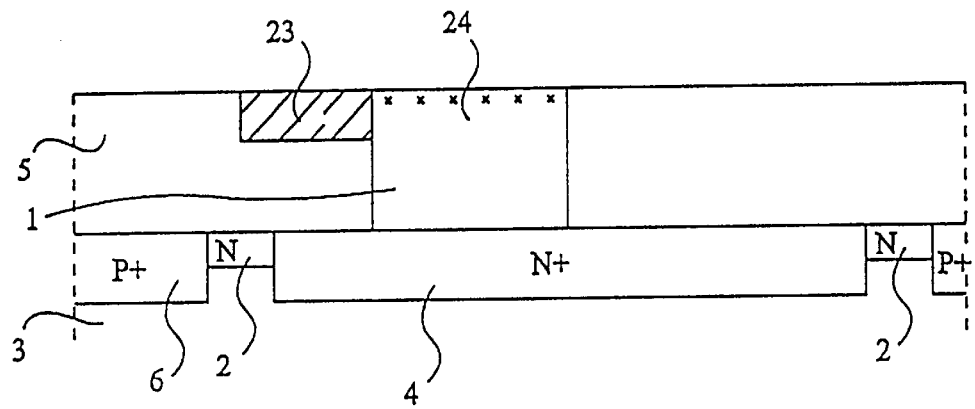

At the following step illustrated in FIG. 4, resist layer 21 is removed, a polysilicon layer is deposited and etched back by any known method to obtain a P-type doped portion of polysilicon 23 filling hollowed portion 22, and the upper surface of which is in the plane of the upper surface of island 1. Preferably, the etching of the polysilicon is performed by a chem-mech polishing which stops on silicon nitride layer 20, this layer 20 being removed at a subsequent step.

An implantation of a P-type doping on the entire surface of the component is then performed to obtain an implantation of P-type doping 24 at the upper surface of island 1. This implantation will be used to form the intrinsic base of the transistor.

Figure 5:
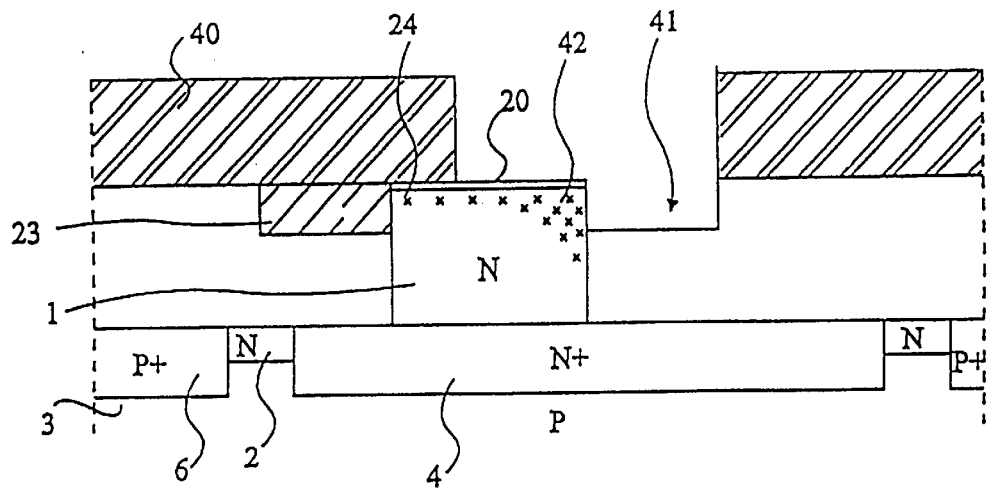

At the following step, illustrated in FIG. 5, a resist layer 40, opened on one side of island 1 opposite to that where base polysilicon area 23 has been formed, is formed on the structure. By a selective etching of the silicon oxide with respect to the silicon and to the silicon nitride, part of the thickness of thick silicon oxide layer 5 is etched on the side opposite to region 23. Preferably, advantage is taken from the presence of resist layer 40 to perform an implantation, preferably an oblique implantation, of a P-type doping in the upper surface and on one side of island 1, more deeply than above-mentioned doping 24. The dopings thus formed in island 1 are designated with reference 42.

Figure 6:
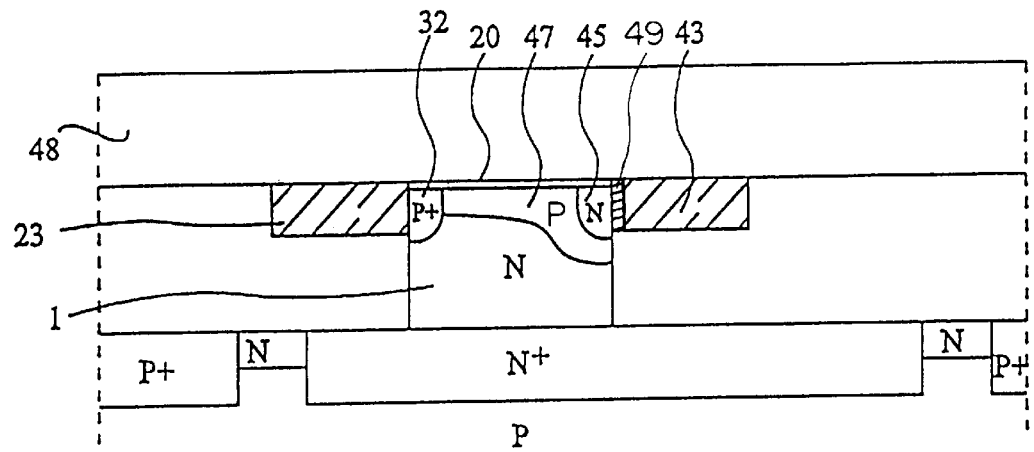

At the following steps, the result of which is illustrated in FIG. 6, hollowed portion 41 is filled with N-type doped polysilicon 43, in the same way as hollowed portion 22 is filled with P-type doped polysilicon 23. Thus, after annealing, a base contact region 32 formed from polysilicon 23 and an emitter region 45 formed from polysilicon 43 are obtained. Base layer 47 is deeper than region 45 because of the previously described lateral or oblique implant.

Given that in this embodiment, silicon nitride layer 20 is left in place, a silicidation can then be performed and a metal silicide (not shown) forms in a self-aligned manner on polysilicon regions 23 and 43. This enables a reduction in the contact resistances and constitutes a further advantage of this embodiment.

Then, as previously, a silicon oxide layer 48 through which openings will be bored and contacts to regions 23 and 43 and buried layer 4 will be made is formed. It can be seen that this method enables obtaining a miniaturized NPN-type bipolar transistor. In particular it will be noted that the emitter, that results from a lateral diffusion can have a width smaller than the minimum possible dimension of an aperture in a mask.

The present invention is likely to have various alternatives and modifications which will occur to those skilled in the art.

As an example only, a structure having the following features can be implemented:

height of island 1: 0.5 $\mu$m, width of island 1: 0.4 $\mu$m, depth of regions 23 and 43: 0.1 and 0.2 $\mu$m, width of regions 23 and 43: 0.25 $\mu$m, thickness of oxide 28, 48: 0.5 $\mu$m.

Further, insulating regions 5, and 28, 48 have been indicated as being silicon oxide. Any other material or combination of materials having the same functions, that is, being insulating and selectively etchable with respect to silicon, could be used.

Figure 7:
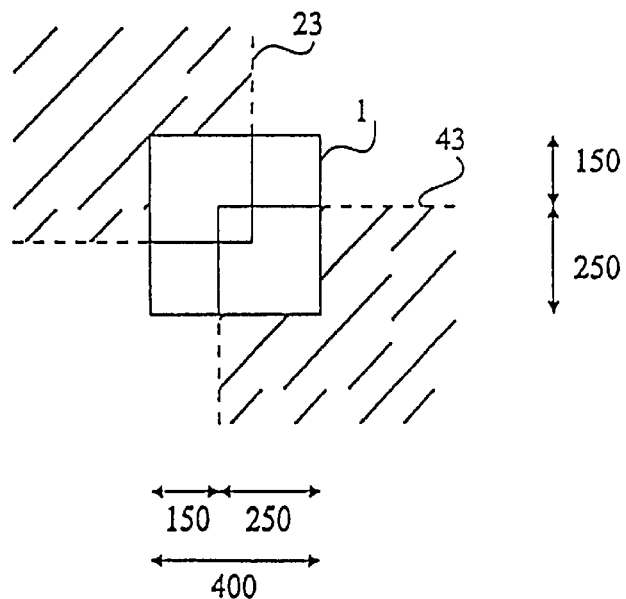
FIG. 7 shows an example of the masks used to define the structure of FIG. 6.

FIG. 7 shows an example of a top view in which the limits of masks from which several regions of the transistor of FIG. 6 are defined have been shown. The contour of island 1 is designated by reference 1. The masks meant to open the hollowed portions in which base and emitter polysilicon regions 23 and 43 respectively will be placed are arranged on two opposite corners of island 1. According to the assumptions taken in the case of FIG. 2, the following minimum dimensions can be obtained:

surface area of island 1: 0.40×0.40 $\mu$m=0.16 $\mu m^2$,
emitter perimeter: 2×0.25=0.50 $\mu$m.

The active surface of the emitter above the collector then is null.

Of course, the present invention is likely to have various alterations, modifications, and improvements which will readily occur to those skilled in the art. In particular, the various materials used can be replaced with materials assuming the same functions (doping, electric characteristics, etching selectivity . . . ).

Especially, for the filling materials of hollowed portions 22 and 41, instead of merely using heavily-doped polysilicon, layers of polysilicon of different levels of doping, or materials or the SiGe-Type 49 and polysilicon can be successively deposited.

Such alterations, modifications, and improvements are intended to be part of this disclosure, and are intended to be within the spirit and the scope of the present invention. Accordingly, the foregoing description is by way of example only and is not intended to be limiting. The present invention is limited only as defined in the following claims and the equivalents thereto.

What is claimed is:

1. A bipolar transistor formed in a portion of a semiconductor substrate of a first conductivity type, said bipolar transistor comprising:

an island having a second conductivity type and corresponding to a collector of said transistor, a first region of first conductivity type formed in at least a first portion of an upper surface of said island and corresponding to a base of said transistor; and an insulating well surrounding said island;

wherein a first portion of an upper internal periphery of the insulating well is hollowed and filled with polysilicon having the first conductivity type to form a base contacting region, and a second portion of the upper internal periphery of the insulating well is hollowed and filled with polysilicon having the second conductivity type to form an emitter contact region.

2. The bipolar transistor of claim 1, wherein a layer of an SiGe-type material is formed at an interface between the island and the polysilicon having the second conductivity type.

3. The bipolar transistor of claim 1, further comprising a second region of second conductivity type formed in the first region of first conductivity type formed on the upper surface of said island and corresponding to an emitter of said transistor.

4. A bipolar transistor, comprising:

a semiconductor substrate having a first conductivity type;

an island having a second conductivity type and corresponding to a collector of said bipolar transistor formed on said semiconductor substrate;

an insulating well surrounding said island;

a first region of the first conductivity type formed in at least a first portion of an upper surface of said island and corresponding to a base of said transistor;

a second region of the second conductivity type formed in the first region of first conductivity type and corresponding to an emitter of said transistor;

a first polysilicon region formed in a first removed portion of insulating material surrounding said island, said first polysilicon region contacting said base region of said transistor; and a second polysilicon region formed in a second removed portion of the insulating material surrounding said island, said second polysilicon region contacting said emitter region of said transistor.

5. The transistor of claim 4, wherein the second region of second conductivity type is formed on the upper surface of the island.

6. The transistor of claim 4, wherein the island is formed on a localized region of second conductivity type formed on said semiconductor substrate.

7. The transistor of claim 4, wherein said first removed portion extends only partially around a circumference of said island.

8. The transistor of claim 4, wherein said second removed portion extends only partially around a circumference of said island.

9. The transistor of claim 4, wherein first removed portion extends only partially around a circumference of said island, said second removed portion extends only partially around a circumference of said island, and wherein said first polysilicon region and said second polysilicon region are isolated from each other by at least one of said island and said insulating material.

10. The transistor of claim 9, wherein said first polysilicon region and said second polysilicon region are isolated from each other by both said island and said insulating material.

11. The transistor of claim 4, wherein second region of second conductivity type is formed by thermal diffusion of the second conductivity type from the polysilicon of second conductivity type.

* * * * *

UNITED STATES PATENT AND TRADEMARK OFFICE
CERTIFICATE OF CORRECTION

PATENT NO. : 6,114,743
DATED : September 5, 2000
INVENTOR(S) : Yvon Gris

It is certified that error appears in the above-identified patent and that said Letters Patent is hereby corrected as shown below:

Title page, col 2, The Attorney, Agent, or Firm section should read:

*Attorney, Agent, or Firm* -- Wolf, Greenfield & Sacks, P.C.; James H. Morris, Theodore E. Galanthay Signed and Sealed this Fifteenth Day of May, 2001

*Attest:*

NICHOLAS P. GODICI

*Attesting Officer*     *Acting Director of the United States Patent and Trademark Office*